United States Patent [19]

Masi

[11] 4,106,951
[45] Aug. 15, 1978

[54] PHOTOVOLTAIC SEMICONDUCTOR DEVICE USING AN ORGANIC MATERIAL AS AN ACTIVE LAYER

[75] Inventor: James V. Masi, Huntington, Conn.
[73] Assignee: UCE, Inc., South Norwalk, Conn.
[21] Appl. No.: 713,880
[22] Filed: Aug. 12, 1976
[51] Int. Cl.² .......................................... H01L 31/06
[52] U.S. Cl. .................................. 136/89 NB; 357/8; 357/16; 357/30; 357/61; 252/62.3 Q
[58] Field of Search ...................... 136/89 NB, 89 SJ; 357/8, 16, 30, 61; 252/62.3 Q

[56] References Cited

U.S. PATENT DOCUMENTS 3,844,843  10/1974  Kay et al. .......................... 136/89 X

OTHER PUBLICATIONS

H. Meier et al "Zum Problem der pn–Ubergange Zwischen Organischen und Anorganischen Photoleitern," Ber. Buns. Phys. Chem, vol. 69, pp. 160–167. (1965).

Primary Examiner—John H. Mack
Assistant Examiner—Aaron Weisstuch
Attorney, Agent, or Firm—Joseph Levinson

[57] ABSTRACT

A photovoltaic semiconductor junction device which is particularly useful as a solar cell comprises a first layer of organic semiconductor material exhibiting one type of electronic conductivity and a second of inorganic semiconductor material having the same or opposite type conductivity. The first layer of organic semiconductor material has an energy bandgap relatively wider than that of the second layer of semiconductor material. The electron affinities of the first and second layers of semiconducting material may be equal, greater, or less than those of the other.

The first layer of organic semiconductor material must either be doped to have a resistivity below $10^6$ ohm-centimeters or be sufficiently thin to allow conduction. In devices employing n-type layers on p-type substrates, the conduction band energy level of the organic material is preferably at substantially the same energy level as the conduction band energy level of the narrower band gap semiconductor material. In devices employing p-type layers, the valence band energy level of the organic material is preferably at substantially the same energy level as the valence band energy level of the narrower bandgap inorganic semiconductor material.

5 Claims, 7 Drawing Figures

PHOTOVOLTAIC SEMICONDUCTOR DEVICE USING AN ORGANIC MATERIAL AS AN ACTIVE LAYER

BACKGROUND OF THE INVENTION

This invention relates to a semiconductor junction device, and more particularly to a photovoltaic heterojunction device which is particularly useful as a solar cell.

Conventional solar cells typically comprise a p-n junction formed in a monocrystalline silicon substrate. Typically, an n-type surface region is diffused into a p-type silicon substrate and ohmic contacts are applied. When the device is exposed to solar radiation, photons incident upon the n-type surface travel to the junction and the p-type region where they are absorbed in the production of electron whole pairs. Holes created or which diffuse to the junction region are swept by the built-in voltage to the n-type surface region of the device where they either leave the device as photocurrent or accumulate to produce photo-induced open circuit voltage.

The conversion efficiency of conventional solar cells, however, is seriously limited by a number of factors. First, the built-in voltage is limited by the relatively narrow bandgap of the n-type silicon and the limited extent to which both layers of silicon can be doped. While the built-in voltage of the device can be increased by increased doping of both layers forming the junction, such excess doping tends to reduce conversion efficiency by reducing the lifetime of the carriers and thereby the collection efficiency of the device. As a consequence, the open circuit voltage of a typical silicon solar cell is only about 50% of the silicon bandgap. Secondly, silicon tends to absorb high energy photons, i.e. blue and ultraviolet light, very near the surface and typically within a micron thereof. As a consequence, many of the high energy photons are absorbed near the surface of the n-type region, causing carriers generated by such absorption to recombine at the surface and become lost as sources of photocurrent. Still a third limiting factor resides in the fact that lower energy photons, i.e. red and near infrared light, tend to penetrate deeply into the silicon before they are absorbed. While minority carriers created by deep absorption can contribute to the photocurrent if minority carrier lifetimes are sufficient to permit them to drift into the junction region, the high temperature diffusion step required to form the n-type region significantly reduces minority carrier lifetime in the p-type silicon substrate. As a consequence, many carriers created by deep absorption are lost as sources of photocurrent.

Accordingly, it would be highly desirable to overcome some of the aforesaid problems associated with conventional type solar cells, which would improve performance by providing improved conversion efficiency.

SUMMARY OF THE INVENTION

In accordance with the present invention, photo-voltaic semiconductor heterojunction devices are provided in which an organic material is utilized as an active layer in the device. By properly selecting the bandgaps, electron affinities, and energy levels of the organic material as well as the other semiconductive material forming the heterojunction of the device, photovoltaic devices are provided having improved conversion efficiencies.

In carrying out this invention in one illustrative embodiment thereof, an improved photovoltaic heterojunction device is provided which is comprised of a first layer of organic semiconductor material exhibiting one type of electronic conductivity, and a second layer of inorganic semiconductor material having the same or the other type of electronic conductivity in which the first and second layers are disposed in contact with each other, forming a semiconductor heterojunction therebetween. The energy bandgap of the organic semiconductor material is relatively wider than the energy bandgap of the inorganic semiconductor material. In devices employing n-type organic layers, the conduction band energy level of the organic material is preferably greater than or at substantially the same energy level as the conduction band energy level of the inorganic material. In devices employing p-type organic layers, the valence band energy level of the organic material is preferably less than or at substantially the same energy level as the valence band energy level of the inorganic material.

DESCRIPTION OF THE PREFERRED EMBODIMENTS

Figure 1:
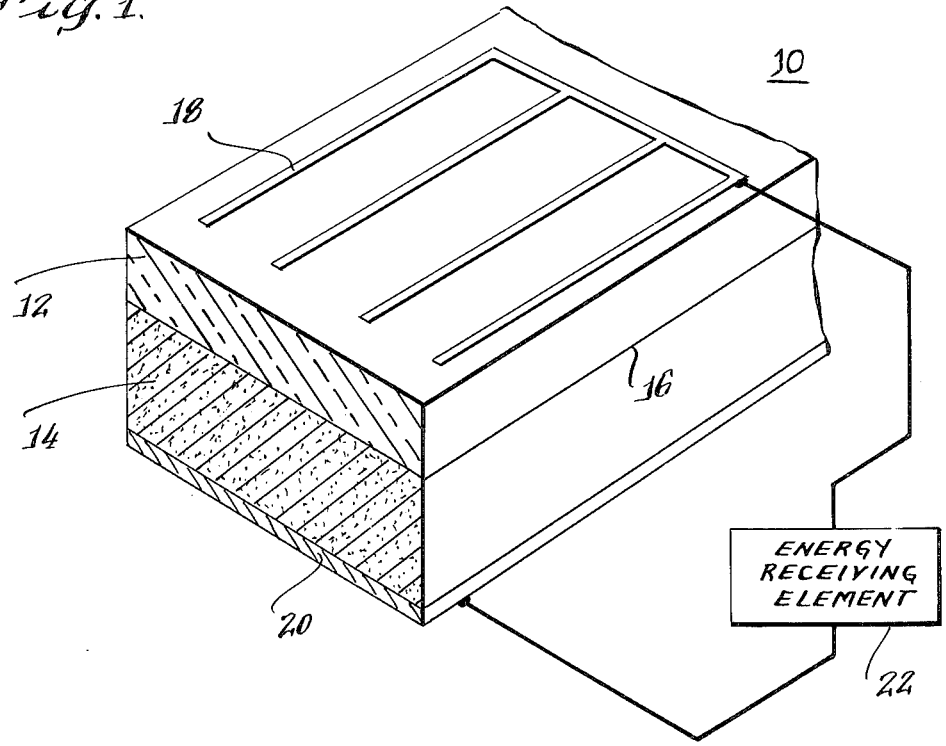
FIG. 1 is an isometric view of a photovoltaic heterojunction device in accordance with the present invention.
Figure 2A:
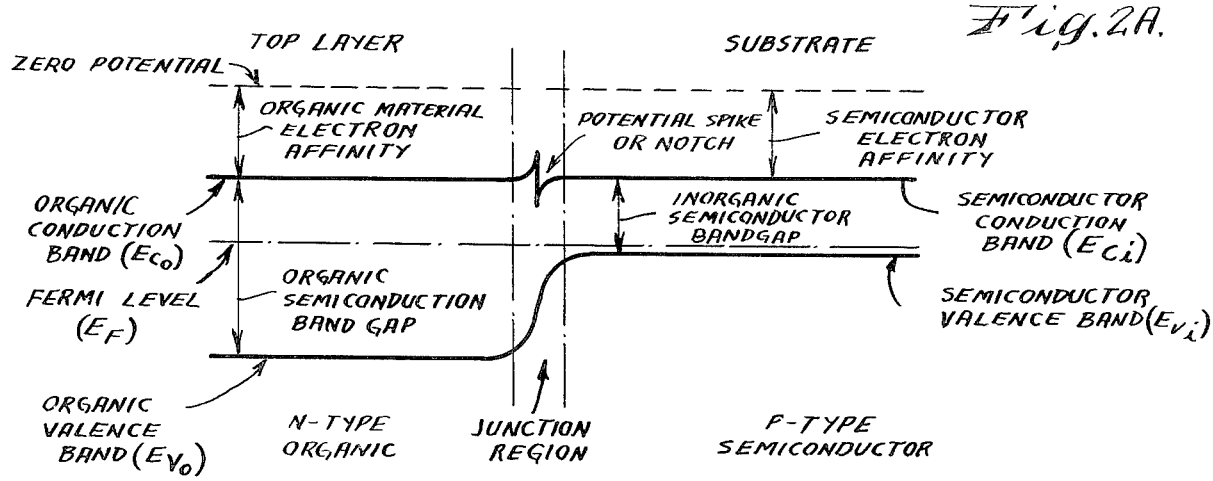
FIGS. 2A – 2D are energy level diagrams for the different conductivity types of layers for the device of FIG. 1.
Figure 2B:
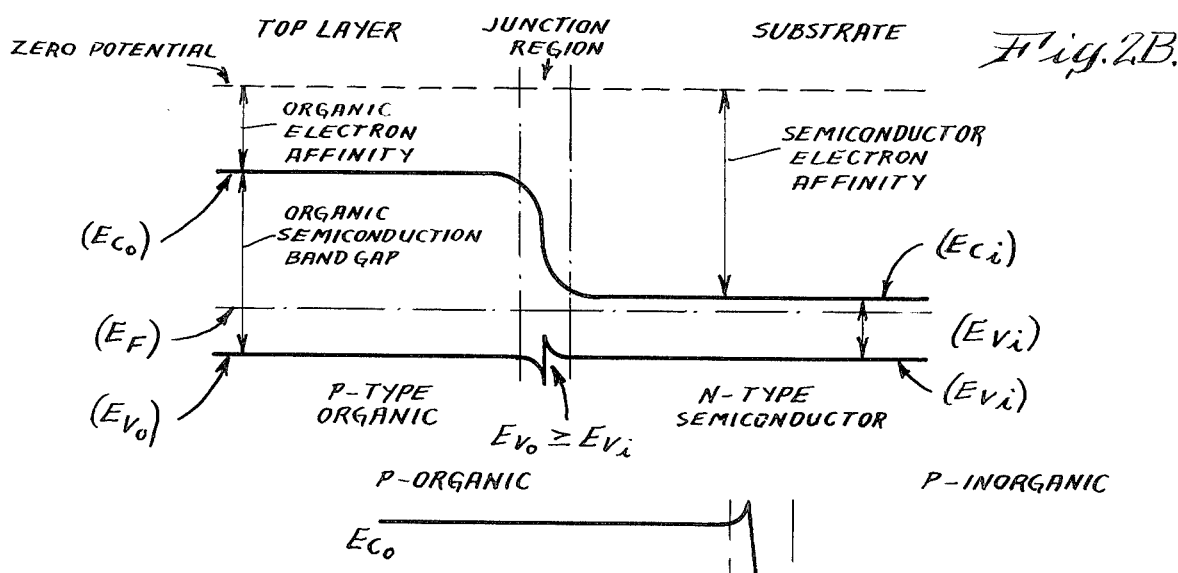
Figure 2C:
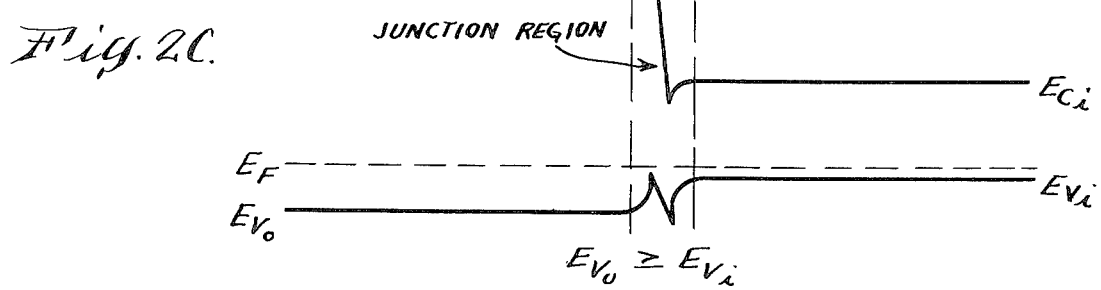
Figure 2D:
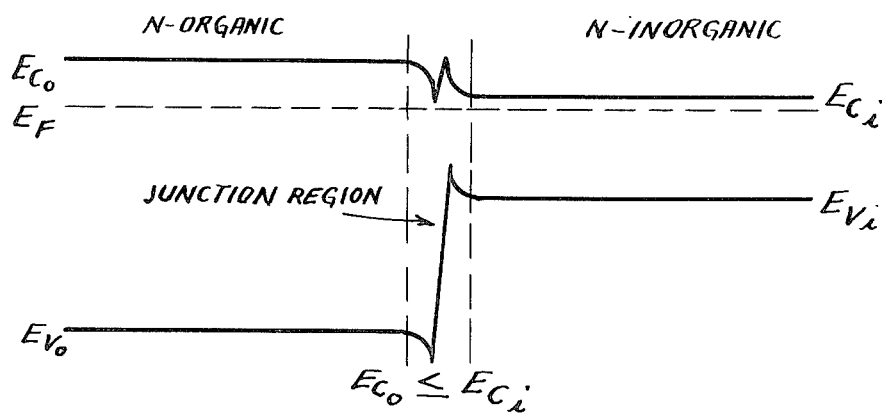

Referring now to FIG. 1, a photovoltaic heterojunction device referred to generally with the reference character 10 is provided comprising a first active or top layer 12 or organic semiconductor material exhibiting one type of electronic conductivity (n or p), and a second active layer or substrate 14 of a compositionally different semiconductor material exhibiting the opposite or the same electronic conductivity type as the first layer. The first and second layers 12 and 14, respectively, are disposed in contact with each other, forming a semiconductor junction 16 therebetween. Suitable electrodes 18 and 20 are applied to the layers 12 and 14 respectively, for making ohmic electrical contact therewith. Electrode 18, which is in ohmic contact with the organic layer 12 to which incident radiation is applied, is preferably a reduced area type electrode having a grid or finger configuration (as shown in FIG. 1) in order to permit greater exposure of the surface of the layer 12 to incident radiation. In the alternative, a transparent electrode 18 may be provided which passes all incident radiation of the wavelengths of interest directly to the active layer 12. The electrodes 18 and 20 are in turn electrically coupled to an energy receiving element or load 22 which is suitable for receiving and utilizing electrical currents generated by the photovoltaic device 10.

The materials for the first or top layer 12 and the second or substrate 14 must be carefully chosen to meet a number of basic requirements. First of all, the materials should be compositionally different, which means that the material, excluding dopants, of layer 12 is of a different chemical element or compound from the element or compound of which layer 14 is formed, so that a heterojunction is formed between the two layers.

The second layer or substrate 14 consists of an inorganic semiconductor material such as silicon, germanium, gallium arsenide, silicon carbide, indium phosphide, cadmium sulfide, a polycrystalline semiconductor such as polycrystalline film of silicon or $Si_xGe_{1-x}$, etc. Preferably, the inorganic semiconductor material of the layer or substrate 14 is doped with n- or p-type impurities such as arsenic, antimony, or phosphorus for n-type silicon, and boron, gallium, or indium for p-type silicon, to exhibit a level of resistivity on the order of 1 to 10 ohms-cms. Doping concentration on the order of $10^{15}$ to $10^{19}$ impurity atoms per cubic centimeter are typically sufficient to achieve such resistivities.

The difference in composition required by the present invention is met by making the first or top layer 12 out of an organic semiconducting material. The organic material acts as a window, an antireflection coating so that the desired radiation is not lost at the surface of the layer, as an absorber and a converter of incident radiation at shorter wavelengths. The organic semiconductor material of the first layer 12 must meet a number of energy band requirements in comparison with layer 14, which will be described subsequently in connection with the energy level diagrams of FIGS. 2A - 2D. The organic material of layer 12 also must be thin enough or be able to be doped such that the resistivities are below $10^6$ ohm/cm. Suitable organic materials for the first layer 12 used with an n-type inorganic substrate or second layer 14 are pyrene, anthracene, α-adiphenyl-β-picryl hydragida (DPPH), paranthrone, and photopolymers of the esterfied polyvinyl cinnamates or allyl ester resins. Organic materials which would be suitable for use for the layer 12 with a p-type inorganic layer 14 are tetraczanoquinodinethan (TCHQ), uranine, and perylene. Suitable dopants for the organic materials listed above are iodine and bromine, with doping concentrations on the order of $10^{12}$ to $10^{19}$ impurity atoms per cc in order to achieve resistivities of below $10^6$ ohm/cms.

As has been previously pointed out, the organic material of the first layer 12 should have a specific relative bandgap and electron affinity in relation to the corresponding characteristics of the inorganic semiconductor material of layer 14. Also, the material of layer 12 has energy bands at specific relative levels in comparison to those of the inorganic semiconductor material of the second layer 14. Such relationships are shown on the energy level diagrams 2A, 2B, 2C, and 2D in which the energy levels and bands of the organic material of the first layer 12 are illustrated on the left of the aforesaid figures, while the characteristics of the inorganic semiconductor material of the second layer 14 are shown on the right of the aforesaid diagram with the layers being separated by a junction region therebetween. The energy level diagrams of FIGS. 2A - 2D are characterized by having a bandgap separating a conduction energy level from a valence energy level band and by an electron affinity separating the conduction energy level band from a level of zero potential energy. The energy band and level diagrams seen in FIGS. 2A - 2D are for the various types of junctions, namely np, pn, nn and pp respectively, which may be employed in the heterojunction device 10 in accordance with the present invention. It will be apparent from the energy band diagrams 2A - 2D that in accordance with the present invention, regardless of the type of junction employed, the first layer 12 of organic material has an energy band gap relatively wider than the second layer 14 of inorganic semiconductor material. The bandgap of the organic material is preferably at least twice the bandgap of the narrower bandgap inorganic semiconductor layer 14. Accordingly, when the narrower bandgap material of layer 14 is silicon, the bandgap of the organic layer 12 should be larger than 2.22 electron volts, and when the narrower bandgap material of layer 14 is gallium arsenide, the wider bandgap organic material 12 should be larger than about 2.8 electron volts. This larger bandgap of the organic layer 12 permits utilization of a larger portion of the narrower bandgap in the built-in voltage, thereby increasing the voltage factor of the device 10.

The use of a wider bandgap material for the layer 12 with respect to the narrower bandgap material for the layer 14 produces potential spikes or notches in the junction regions as shown in FIGS. 2A - 2D, which can be undesirable barriers to current. Accordingly, when the device 10 is used as a photovoltaic device, the electron affinity of the larger bandgap material is preferably chosen to minimize the notch impedance. This selection process can result in the electron affinities of the organic layer being greater than or equal to, or less than or equal to, the electron affinity of the inorganic layer 14. In choosing the materials of the respective layers, the electronic affinities are preferable which reduce the potential spikes or notches to thin dimensions so that carriers can readily tunnel through and produce conduction in the device 10.

The bandgap and electron affinities of component materials are well defined and generally tabulated quantities. Bandgaps are tabulated as such, and electronic affinities can be obtained by subtracting the tabulated barrier heights from tabulated work functions. Reference should be made to the American Institute of Physics Handbook, 3d Edition, 1942 (McGraw, Hill) for tabulations of typical materials. As can be seen by reference to FIGS. 2A - 2D, the relative positions of the conduction band energy level and the valence band energy level are substantially determined by the electron affinity and the bandgap. The conduction band energy level is below the zero potential by an amount of the electron affinity, and the valence band energy level is below zero potential by an amount substantially equal to the electron affinity increased by the bandgap.

The heterojunction device 10 of FIG. 1 can be readily fabricated using conventional techniques to provide an improved and inexpensive solar cell. A thin layer of organic material having a thickness from 0.1 to 100 micrometers is deposited on a semiconductor substrate by conventional means such as vacuum evaporation. The semiconductor substrate may be from 1 to 100 micrometers in thickness and be composed of inorganic semiconductor materials previously set forth. The type of organic and inorganic semiconducting materials which are used to form the heterojunction are chosen to meet the requirements set forth previously. The organic material, if not deposited in a thin enough layer to provide a suitable resistivity, is doped by conventional diffusion doping to the desired resistivity level. The electrodes are then deposited by vacuum deposition, sputtering, or plating, and the resulting devices are packaged. The electrodes are then connected to the energy-receiving element 22 or utilization circuitry such as a battery in charging polarity.

As an example, the fabrication of an n-p junction device will be described using a polymer as the organic layer 12. The polymer may be a polyvinyl cinnamate derivative, e.g.

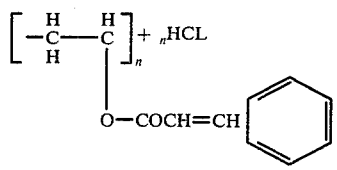

Figure 4:
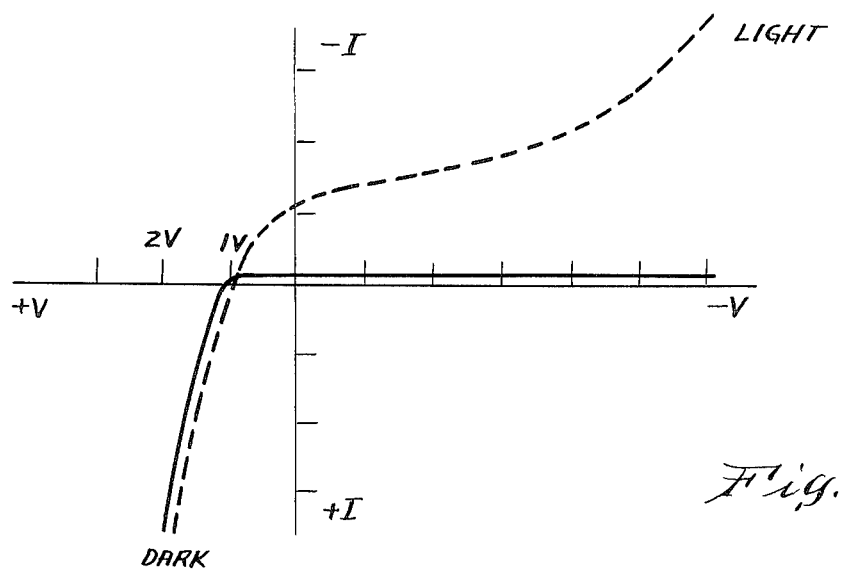
FIG. 4 is a light-dark current vs. voltage graph of an illustrative embodiment of a photovoltaic device of the present invention.

The polymer is altered with iodine additive and polymerized with light and heat. A 1% iodine in methyl alcohol solution is added to the photopolymer of 50% xylene and 50% polyvinyl cinnamate (50% by volume). This mixture is spun onto a 1 ohm/cm silicon slice (p type) at 3500 rpm and dried at 80° C for approximately 10 minutes. The device is then exposed under ultraviolet fluorescent bulbs (1 mw/cm$^2$ at 3650Å, 3–15 watts) at a distance of 6 inches and baked for 15 minutes at approximately 140° C. Aluminum contacts (1 micrometer thick) are evaporated on the upper and lower layers 12 and 14, with the finger-type contacts on the upper layer 12 of polyvinyl cinnamate. The device size is 2 mm × 2 mm. Illuminating the cell with a tungsten halogen lamp (100 mw/cm$^2$) produces the light-dark, current-voltage curves shown in FIG. 4. The open circuit voltage is approximately 0.85 and the short circuit current approximately 11 microamps.

Examples of other polymers which may be used in the example above include vinyl ester containing cinnamylidene, allyl ester prepolymer, cyclized rubber derivative and hydrocarbon copolymers.

Figure 3:
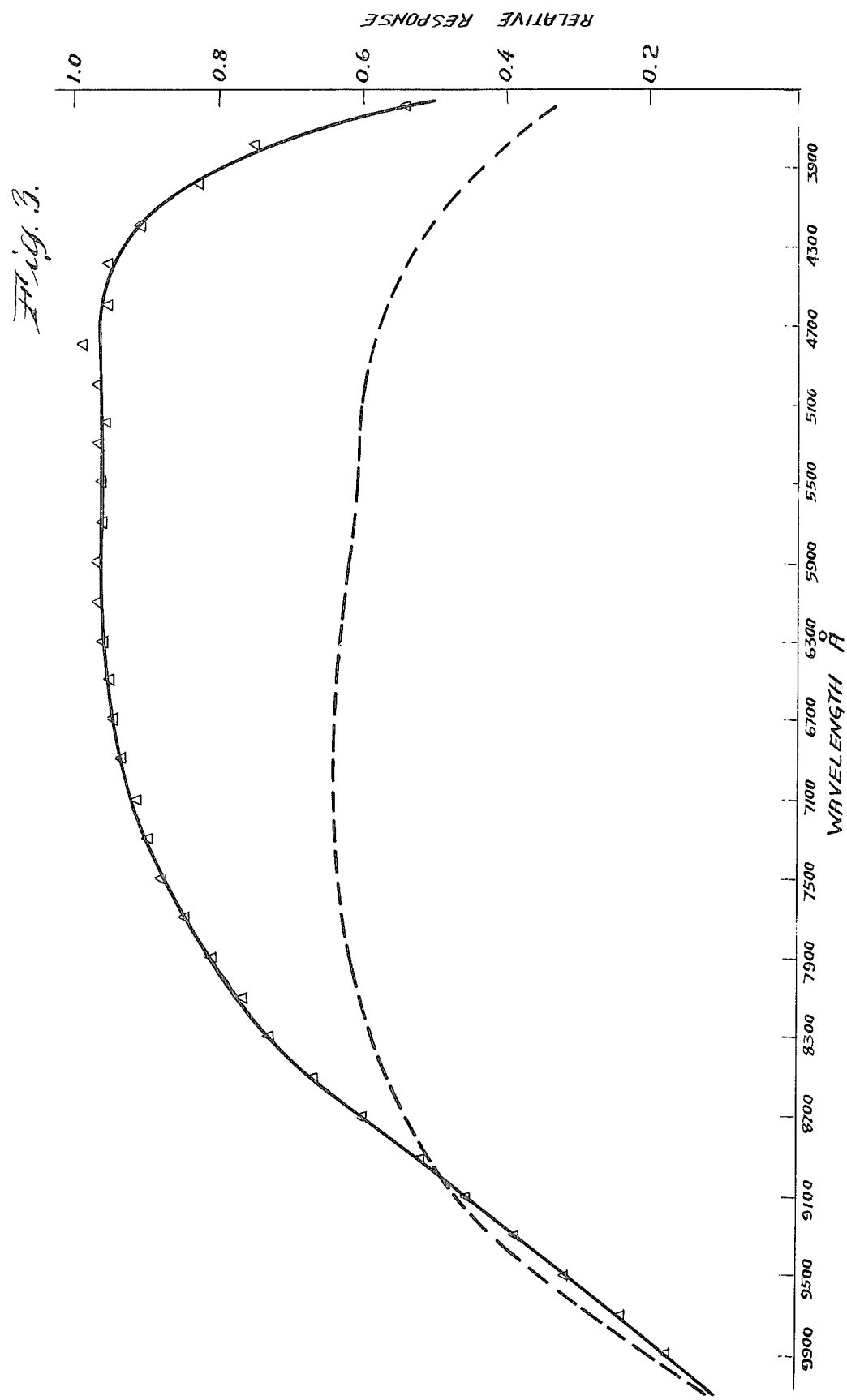
FIG. 3 is a graph of relative response vs. wavelength comparing the response of the device of the present invention with that of a conventional device.

FIG. 3 shows a graph of relative response vs. wavelength for the photovoltaic device 10 of the present invention fabricated in accordance with the aforesaid example using polyvinyl cinnamate on a silicon substrate which is indicated by the solid curve. The dotted curve shows the response of a conventional silicon homojunction solar cell. As will be apparent from the curves, the device of the present invention compares favorably and is superior in certain spectral regions.

In operation as a solar cell, the device 10 of FIG. 1 is exposed to solar radiation and electrical energy flows from the device 10 to the load or energy-receiving element 22. The flow of electrical energy from the device 10 is believed to result from the photoconductivity of the device in the presence of incident radiation on the first layer 12 of the device 10. It is believed that the organic material of the first layer 12 acts as a window as well as an anti-reflection coating in which portions of the incident radiation pass through the organic layer 12 to the junction 16 and the semiconductor substrate 14. Portions of the incident radiation are also believed to be absorbed and converted into photocurrent, particularly at the shorter wavelengths. Photons of the radiation are absorbed in the substrate 14 by the creation of electron-hole pairs. In devices having n-type substrates, holes which are created in the transition region or which diffuse thereto are swept by the built-in voltage to the organic layer 12 where they either contribute to the photocurrent or accumulate to develop an open circuit equilibrium voltage. In devices having p-type substrates 14, electrons are swept into the organic first layer 12, producing the same result as in the devices having the n-type substrates.

The organic/inorganic solar cell as described herein offers many advantages over known solar cells, namely that the devices are thin, cheap, the materials readily available and easy to apply, and a wide range of materials may be utilized in the fabrication of the solar cell. The organic material used on the front layer on which incident radiation is applied acts as a window and is transparent to the incident radiation, which allows all of the light to reach the active substrate. Even the light absorbed by the first layer is also converted by the front layer 12. The flexibility offered by organic materials allows the tailoring of the spectral response by adding fluorescent materials to the organic materials for maximizing the quantum efficiency. Accordingly, the ready ability of the various organic materials to be dyed for spectral sensitivity where it is desired provides great flexibility for the heterojunction device 10 in accordance with the present invention. The organic material exhibits stability when exposed to sunlight and moisture.

Since other modifications, varied to fit particular operating requirements and environments, will be apparent to those skilled in the art, the invention is not considered limited to the examples chosen for purposes of disclosure, and covers all changes and modifications which do not constitute departures from the true spirit and scope of this invention.

What is claimed is:

1. A semiconductor heterojunction device particularly useful as a solar cell, comprising
    (a) first and second layers of different semiconductor materials, said first layer comprising the radiation receiving layer to which incident radiation is applied and consisting a solid, polymeric organic semiconductor material having a resistivity of less than 10$^6$ ohm-centimeters and said second layer consisting of an inorganic semiconductor material,
    (b) said first and second layers each having a bandgap separating a conduction energy level band from a valence energy level band and by an electron affinity separating the conduction energy level band from a level of zero potential energy,
    (c) said first and second layers being disposed in contact with each other forming a semiconductor heterojunction therebetween,
    (d) said first layer of semiconductor material exhibiting one type of conductivity and said second layer of semiconductor material having the same or opposite type conductivity with respect to said first layer,
    (e) said first layer having an energy bandgap wider than said second layer, and
    (f) electrode means positioned on said first and second layers of semiconductor materials for providing electrical connections thereto, said electrode means positioned on said first layer being permeable to the radiation applied to said first layer.

2. The device set forth in claim 1 wherein said first layer is n-type organic and said second layer is p-type inorganic material, the first layer having a conduction band greater than or equal to the conduction band of said second layer.

3. The device set forth in claim 1 wherein said first and said second layer are both n-type material, the first layer having a conduction band greater than or equal to the conduction band of said second layer.

4. The device set forth in claim 1 wherein said first layer is P-type organic and said second layer in n-type inorganic material, the first layer having a valence band equal to or less than the valence band of said second layer.

5. The device set forth in claim 1 wherein the inorganic material of said second layer is selected from the group consisting of silicon, germanium, silicon carbide, indium phosphide, cadmium sulfide, and gallium arsenide.

* * * * *